United States Patent
Kimura et al.

(10) Patent No.: US 10,424,570 B2
(45) Date of Patent: Sep. 24, 2019

(54) POWER CONVERSION APPARATUS

(71) Applicant: DENSO CORPORATION, Kariya, Aichi-pref. (JP)

(72) Inventors: Mitsunori Kimura, Kariya (JP); Hiroshi Shimizu, Kariya (JP); Kengo Mochiki, Kariya (JP); Yasuyuki Ohkouchi, Kariya (JP); Yuu Yamahira, Kariya (JP); Tetsuya Matsuoka, Kariya (JP); Kazuma Fukushima, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/488,818

(22) Filed: Apr. 17, 2017

(65) Prior Publication Data

US 2017/0301662 A1 Oct. 19, 2017

(30) Foreign Application Priority Data

Apr. 19, 2016 (JP) .................................. 2016-083936

(51) Int. Cl.
*H01L 25/18* (2006.01)
*H01L 23/473* (2006.01)
(Continued)

(52) U.S. Cl.
CPC .......... *H01L 25/18* (2013.01); *H01L 23/4012* (2013.01); *H01L 23/433* (2013.01);
(Continued)

(58) Field of Classification Search
CPC ..... H01L 23/433; H01L 23/473; H01L 25/18; H01L 25/117; H01L 25/072; H05K 7/20927; H05K 1/0203
See application file for complete search history.

(56) References Cited

U.S. PATENT DOCUMENTS 9,000,553 B2 * 4/2015 Tokuyama ........... H05K 7/1432
257/499
2010/0213510 A1 * 8/2010 Osawa ............... H01L 23/49562
257/146

(Continued)

FOREIGN PATENT DOCUMENTS

| JP | 2012-234926 A | 11/2012 |
|---|---|---|
| JP | 2014-027816 A | 2/2014 |
| JP | 5863599 B2 | 2/2016 |

*Primary Examiner* — Galina G Yushina
(74) *Attorney, Agent, or Firm* — Oliff PLC

(57) ABSTRACT

A power conversion apparatus performs power conversion. The power conversion apparatus includes a semiconductor module and a cooler. The semiconductor module includes an insulated-gate bipolar transistor, a metal-oxide-semiconductor field-effect transistor, and a lead frame. The insulated-gate bipolar transistor and the metal-oxide-semiconductor field-effect transistor are connected in parallel to each other and provided on the same lead frame. The cooler has a coolant flow passage. The coolant flow passage extends such that the coolant flow passage and the lead frame of the semiconductor module are opposed to each other. The semiconductor module is configured such that the metal-oxide-semiconductor field-effect transistor is not disposed further downstream than the insulated-gate bipolar transistor in a flow direction of a coolant in the coolant flow passage of the cooler.

11 Claims, 13 Drawing Sheets

(51) Int. Cl.
   *H01L 23/495* (2006.01)
   *H01L 25/07* (2006.01)
   *H01L 25/11* (2006.01)
   *H05K 7/20* (2006.01)
   *H05K 1/02* (2006.01)
   *H01L 23/433* (2006.01)
   *H01L 23/40* (2006.01)
   *H01L 23/00* (2006.01)

(52) U.S. Cl.
   CPC ...... *H01L 23/473* (2013.01); *H01L 23/49541* (2013.01); *H01L 23/49548* (2013.01); *H01L 23/49575* (2013.01); *H01L 25/072* (2013.01); *H01L 25/112* (2013.01); *H01L 25/117* (2013.01); *H05K 7/20927* (2013.01); *H01L 23/49568* (2013.01); *H01L 24/32* (2013.01); *H01L 24/33* (2013.01); *H01L 2224/291* (2013.01); *H01L 2224/29082* (2013.01); *H01L 2224/32245* (2013.01); *H01L 2224/33181* (2013.01); *H01L 2924/1033* (2013.01); *H01L 2924/10253* (2013.01); *H01L 2924/10272* (2013.01); *H01L 2924/13055* (2013.01); *H01L 2924/13091* (2013.01); *H05K 1/0203* (2013.01); *H05K 2201/10166* (2013.01); *H05K 2201/10522* (2013.01)

(56) References Cited

U.S. PATENT DOCUMENTS

| | | | |
|---|---|---|---|
| 2013/0062626 A1* | 3/2013 | Takao | H03K 17/127 257/77 |
| 2013/0070502 A1* | 3/2013 | Suzuki | H02M 7/003 363/131 |
| 2013/0155745 A1 | 6/2013 | Tanaka et al. | |
| 2014/0055173 A1* | 2/2014 | Shiraishi | H01L 27/0617 327/109 |
| 2014/0091452 A1* | 4/2014 | Katou | H01L 21/565 257/706 |
| 2014/0226369 A1* | 8/2014 | Kimura | H02M 3/3376 363/21.09 |
| 2014/0284765 A1* | 9/2014 | Kiuchi | H01L 28/40 257/532 |
| 2014/0339693 A1 | 11/2014 | Hotta | |

* cited by examiner

POWER CONVERSION APPARATUS

CROSS-REFERENCE TO RELATED APPLICATION

This application is based on and claims the benefit of priority from Japanese Patent Application No. 2016-083936, filed Apr. 19, 2016. The entire disclosure of the above application is incorporated herein by reference.

BACKGROUND

Technical Field

The present disclosure relates to a power conversion apparatus that performs power conversion.

RELATED ART

A semiconductor module having a combination of an insulated-gate bipolar transistor (IGBT) and a metal-oxide-semiconductor field-effect transistor (MOSFET) has been known as a semiconductor module that configures a power conversion apparatus. The IGBT exhibits excellent performance in high current ranges and the MOSFET exhibits excellent performance in low current ranges. For example, Japanese Patent No. 5863599 discloses a power module that includes an IGBT and a MOSFET as a semiconductor module. In the power module, the IGBT and the MOSFET are connected in parallel to each other. The power module is advantageous in that favorable characteristics of both the IGBT and the MOSFET are provided.

The above-described power module is configured such that the IGBT is provided in a portion of a lead frame that corresponds to a heat sink. The IGBT is cooled as a result of this configuration. That is, the MOSFET has a higher resistance to heat than the IGBT. Therefore, the power module use a structure in which the IGBT is cooled and the MOSFET, which has high heat resistance, is not actively cooled. In this case, the temperature of the MOSFET tends to rise. Thus, a problem may occur in that conduction loss (also referred to as on-state power loss) increases as a result of the temperature of the MOSFET becoming high.

SUMMARY

It is thus desired to provide a power conversion apparatus that is capable of suppressing conduction loss in a semiconductor module.

An exemplary embodiment provides a power conversion apparatus that performs power conversion. The power conversion apparatus includes a semiconductor module and a cooler. The semiconductor module includes an insulated-gate bipolar transistor (IGBT), a metal-oxide-semiconductor field-effect transistor (MOSFET), and a lead frame. The IGBT and the MOSFET are connected in parallel to each other and provided on the same lead frame. The cooler has a coolant flow passage. The coolant flow passage extends such that the coolant flow passage and the lead frame of the semiconductor module are opposed to each other. The semiconductor module is configured such that the MOSFET is not disposed further downstream than the IGBT in a flow direction of a coolant in the coolant flow passage of the cooler.

In the above-described power conversion apparatus, the coolant (refrigerant) that flows through the coolant flow passage of the cooler performs heat exchange with the IGBT and the MOSFET through the lead frames. As a result, the IGBT and the MOSFET are both cooled. At this time, the MOSFET is not disposed further downstream than the IGBT in the flow direction of the coolant in the coolant flow passage of the cooler. That is, the MOSFET is disposed further upstream than the IGBT in the flow direction of coolant in the coolant flow passage or disposed in a position similar to that of the IGBT.

In this case, the order of priority for cooling the MOSFET is not lower than that of the IGBT and thus, the effect of cooling the MOSFET can be enhanced with little influence from the cooling state of the IGBT. Therefore, temperature rise in the MOSFET can be reliably suppressed. As a result, the temperature of the MOSFET does not easily become high, and increase in conduction loss in the MOSFET can be suppressed.

As described above, according to the above-described exemplary embodiment, conduction loss in the semiconductor module can be suppressed in the power conversion apparatus.

DESCRIPTION OF THE EMBODIMENTS

Figure 1:
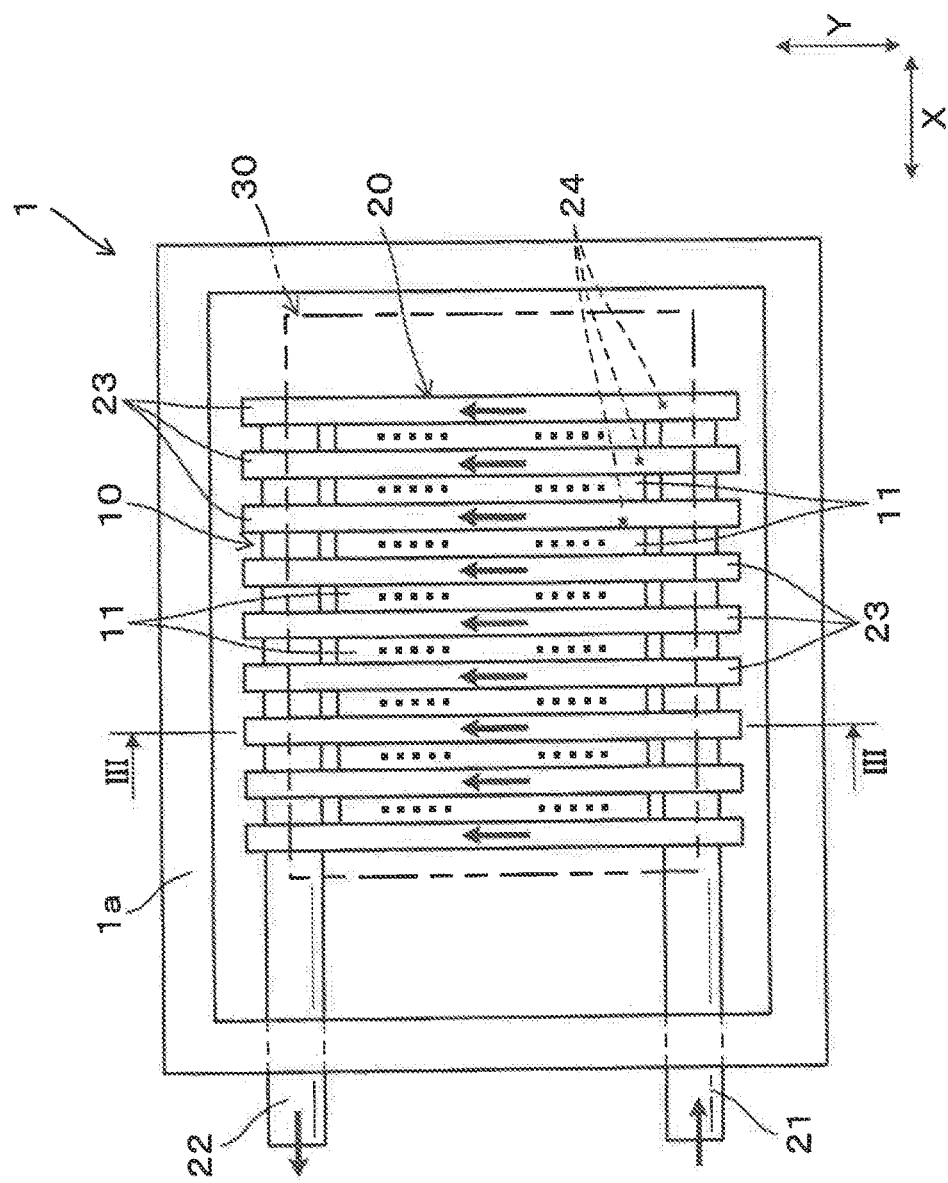
FIG. 1 is a plan view of an overall power conversion apparatus according to a first embodiment.

Embodiments of a power conversion apparatus will hereinafter be described with reference to the drawings.

In the drawings of the present specification, unless otherwise noted, a first direction is indicated by arrow X, a second direction is indicated by arrow Y, and a third direction is indicated by arrow Z. The first direction is a lamination direction (stacking direction) of semiconductor modules and cooling tubes. The second direction is a longitudinal direction of the cooling tube. The third direction is a direction perpendicular to both the first direction and the second direction.

The power conversion apparatus according to the present embodiment performs power conversion. For example, the power conversion apparatus is mounted in an electric car or a hybrid car, and is used as an inverter and a converter. The inverter converts direct-current power-supply power to alternating-current power that is required to drive a drive motor. The converter converts direct-current power to boosted or bucked direct-current power.

First Embodiment

Figure 2:
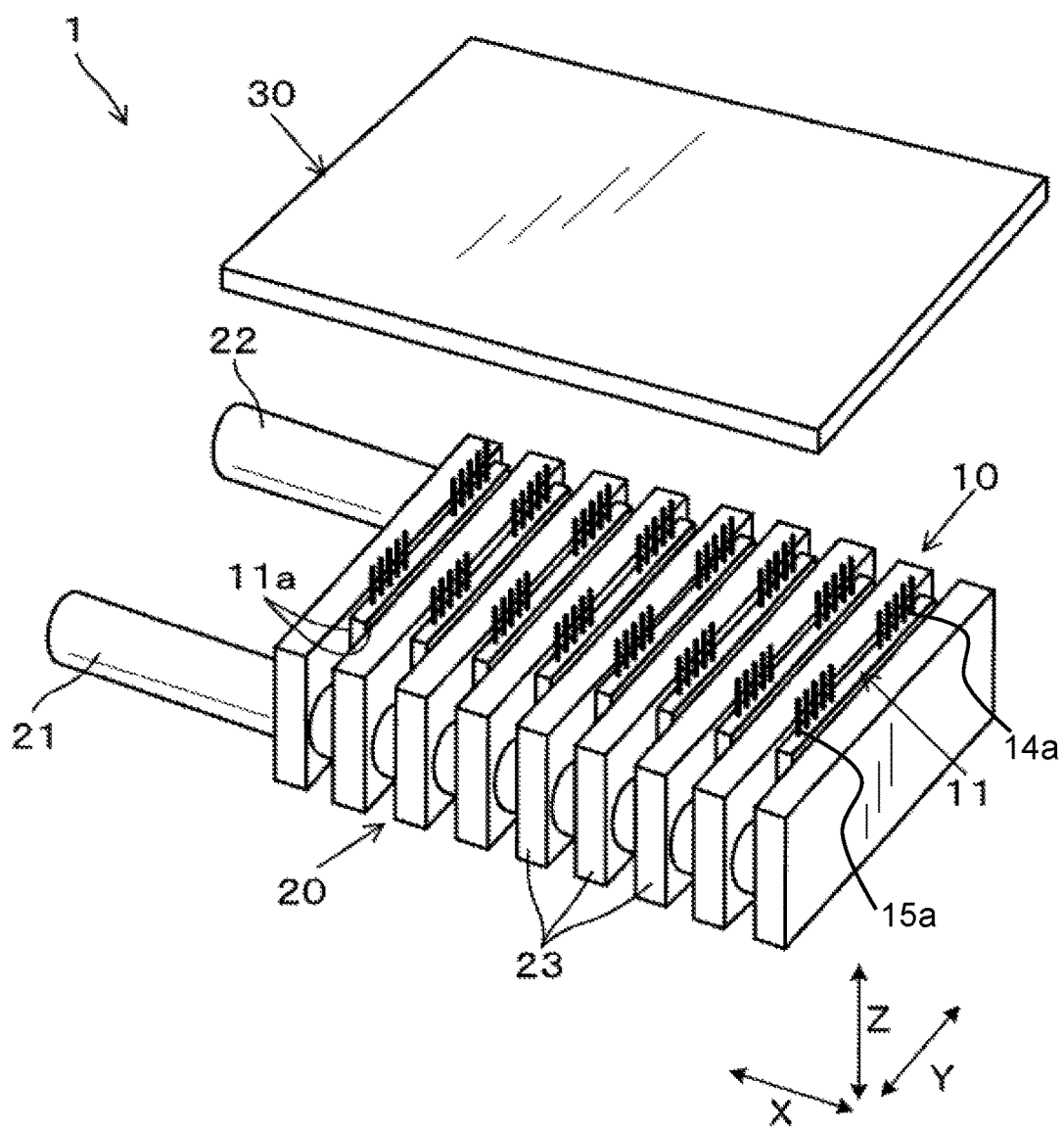
FIG. 2 is an exploded perspective view of the power conversion apparatus in FIG. 1.

As shown in FIGS. 1 and 2, a power conversion apparatus 1 according to a first embodiment includes a plurality of elements including a semiconductor laminated unit (semiconductor stacked unit) 10 and a control circuit board 30. The plurality of elements are housed in a space that is compartmentalized by a case 1a. The case 1a is an automobile component that is required to be lightweight and to have a high level of dimensional accuracy. The case 1a is fabricated by an aluminum die casting method using aluminum.

The semiconductor laminated unit 10 includes a plurality of semiconductor modules 11 and a cooler 20 that cools the plurality of semiconductor modules 11. The cooler 20 includes an inflow tube (inflow header) 21, an outflow tube (outflow header) 22, and a plurality of cooling tubes 23. The inflow tube 21 extends in the first direction X. The outflow tube 22 extends in the first direction X. The plurality of cooling tubes 23 all extend in the second direction Y and are arranged so as to be spaced apart in the first direction X at a predetermined interval.

In the semiconductor laminated unit 10, the plurality of semiconductor modules 11 and the plurality of cooling tubes 23 are alternately laminated (stacked) in the first direction X. In this case, the semiconductor module 11 has two outer surfaces 11a and 11a that extend in parallel to each other. The cooling tubes 23 are provided so as to abut on each of the two outer surfaces 11a and 11a of the semiconductor modules 11. That is, each semiconductor module 11 is sandwiched from both sides by two cooling tubes 23 and 23. The semiconductor laminated unit 10 may also be referred to as a power conversion apparatus or a semiconductor module.

A plurality of control terminals (a plurality of control terminals 14a and 15a, described hereafter) of the semiconductor modules 11 are each connected to the control circuit board 30. A control current for controlling the switching operations of the semiconductor elements of the semiconductor modules 11 is inputted from the control circuit board 30 to the semiconductor modules 11 through the plurality of control terminals.

In the cooler 20, respective inflow portions of the plurality of cooling tubes 23 are coupled to the inflow tube 21. Respective outflow portions of the plurality of cooling tubes 23 are coupled to the outflow tube 22. In addition, the cooling tubes 23 have a coolant flow passage 24 therein. Therefore, a coolant (refrigerant) that has flowed from the inflow tube 21 into the inflow portion of the cooling tube 23 cools the semiconductor modules 11 that abut on the cooling tube 23 when passing through the coolant flow passage 24 within the cooling tube 23. The coolant is then discharged from the outflow portion of the cooling tube 23 into the outflow tube 22. The cooler 20 is composed of a material that has excellent heat conductivity, such as aluminum.

Figure 3:
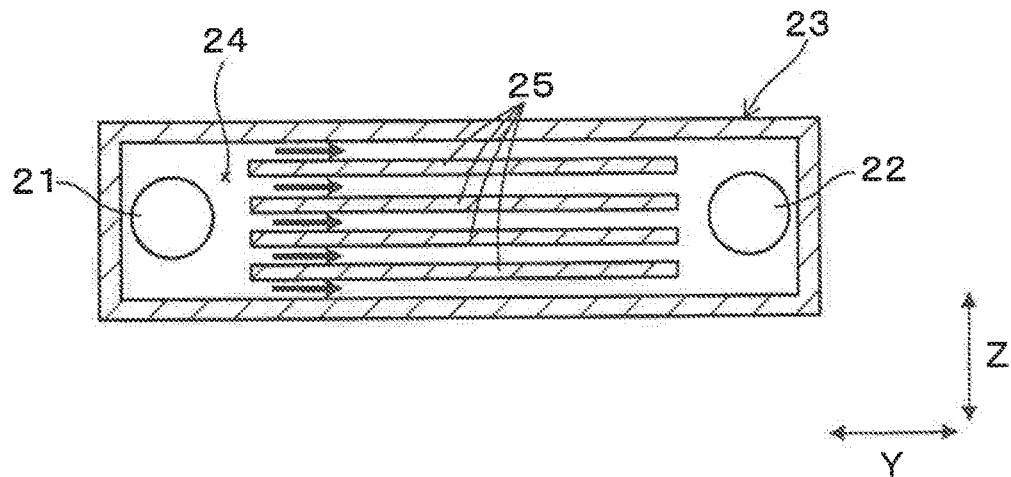
FIG. 3 is a cross-sectional view taken along line III-III in FIG. 1.
Figure 4:
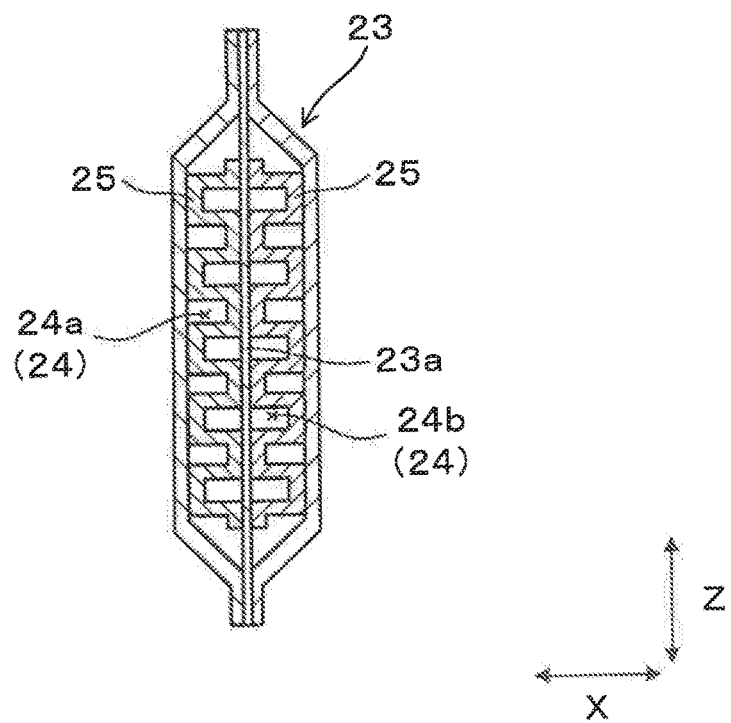
FIG. 4 is a cross-sectional view along one direction of a cooling tube in FIG. 1.

As shown in FIGS. 3 and 4, the cooling tube 23 includes a partitioning member 23a that partitions the coolant flow passage 24 within the cooling tube 23 into two spaces 24a and 24b in the first direction X. Heat dissipating fins 25 are provided in each of the two spaces 24a and 24b. The heat dissipating fin 25 extends in a direction intersecting the flow direction of the coolant in the coolant flow passage 24. The heat dissipating fins 25 have an effect of improving heat exchange efficiency by increasing the contact area with the coolant, thereby enhancing cooling performance. In particular, when the heat dissipating fins 25 are configured to extend in a direction perpendicular to the flow direction of the coolant in the coolant flow passage 24, the effect of improving the cooling performance becomes high.

As the coolant that is sent through the coolant flow passage 24 of the cooling tubes 23, for example, a natural coolant such as water or ammonia, water mixed with an ethylene glycol-based antifreezing solution, a fluorocarbon-based coolant such as Fluorinert, a chlorofluorocarbon-base coolant such as HCFC 123 or HFC 134a, an alcohol-based coolant such as methanol or alcohol, or a ketone-based coolant such as acetone may be used.

Figure 5:
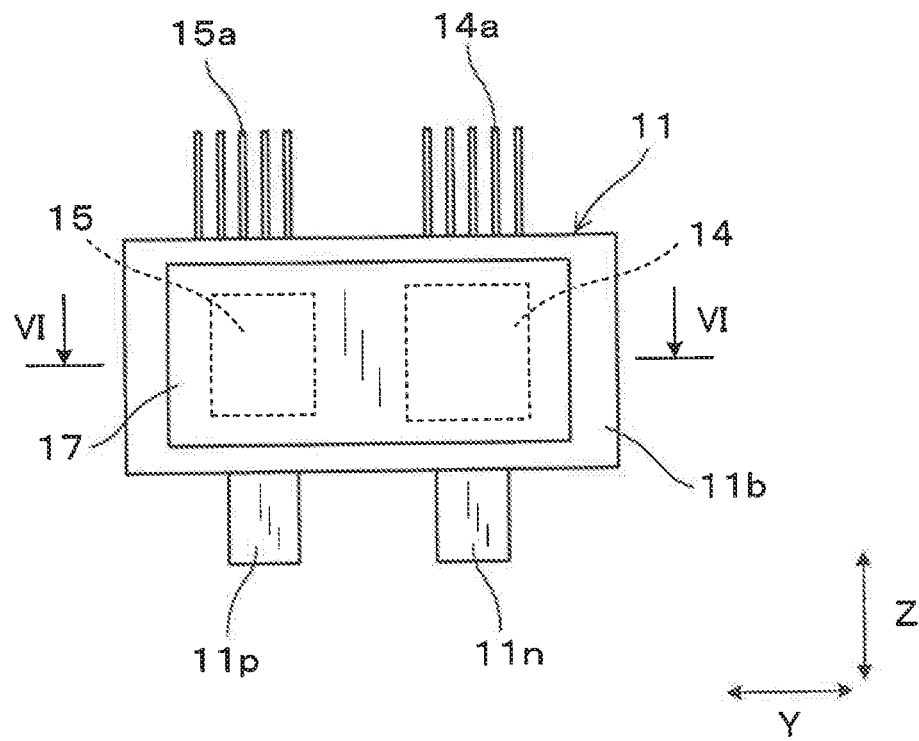
FIG. 5 is a side view in a thickness direction of a semiconductor module in FIG. 1.
Figure 6:
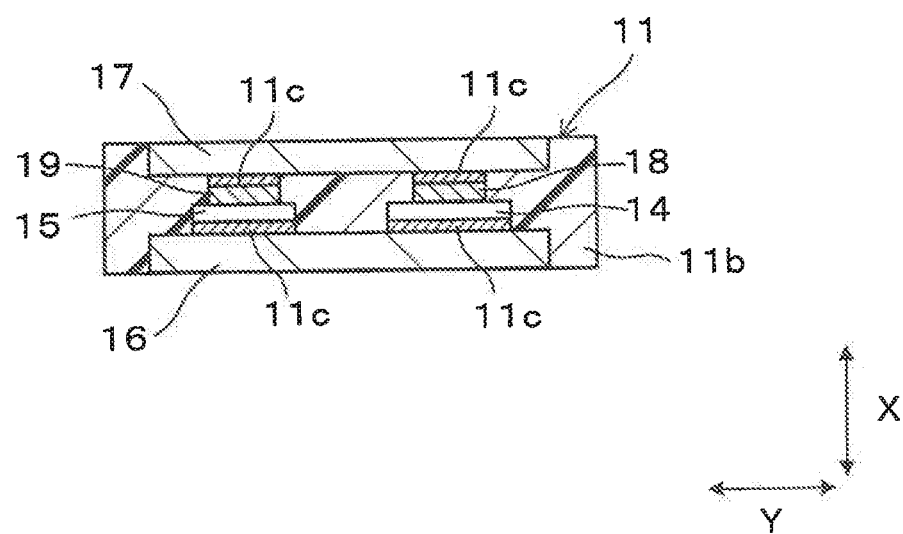
FIG. 6 is a cross-sectional view taken along line VI-VI in FIG. 5.

As shown in FIGS. 5 and 6, the semiconductor module 11 includes an IGBT 14, a MOSFET 15, and lead frames 16 and 17. The semiconductor module 11 is provided with a single semiconductor pair composed of the IGBT 14 and the MOSFET 15, and is referred to as one-in-one module.

The IGBT 14 and the MOSFET 15 are both switching elements. According to the present embodiment, the IGBT 14 is an insulated-gate bipolar transistor composed of a silicon (Si)-based material. The MOSFET 15 is a field-effect transistor composed of a wide-bandgap semiconductor. The IGBT 14 has excellent high-current characteristics and is less expensive than the MOSFET 15. The MOSFET 15 has excellent low-current characteristics and high-speed switching characteristics.

As the MOSFET 15 that is composed of a wide-bandgap semiconductor, a wide-bandgap semiconductor element composed of a silicon carbide (SiC)-based material or a gallium nitride (GaN)-based material is preferably used.

As shown in FIG. 6, the semiconductor module 11 is molded with molding resin 11b.

One element surface of the IGBT 14 is joined to the lead frame 16 via a solder layer 11c. The other element surface of the IGBT 14 is joined to a terminal 18 that is joined to the lead frame 17 via another solder layer 11c.

One element surface of the MOSFET 15 is joined to the lead frame 16 via a solder layer 11c. The other element surface of the MOSFET 15 is joined to a terminal 19 that is joined to the lead frame 17 via another solder layer 11c.

The lead frames 16 and 17 support and fix both the IGBT 14 and the MOSFET 15. In addition, the lead frames 16 and 17 configure input/output terminals that receive input from the outside and perform output to the outside. The lead frames 16 and 17 are each composed of a thin sheet made of a copper (Cu) alloy-based material, an iron alloy-based material, or other metal materials having excellent mechanical strength, electric conductivity, heat conductivity, corrosion resistance, and the like.

The semiconductor module 11 has a P terminal 11p and an N terminal 11n that serve as power terminals. The P terminal 11p and the N terminal 11n extend in parallel to each other from the lead frames 16 and 17. The P terminal 11p extends along the third direction Z from the lead frame 16. The N terminal 11n extends along the third direction Z from the lead frame 17. A direct-current voltage is applied to the semiconductor module 11 via the P terminal 11p and the N terminal 11n.

In the semiconductor module 11 according to the present embodiment, the IGBT 14 and the MOSFET 15 are provided on the same lead frame 16. Alternatively, the IGBT 14 and the MOSFET 15 may be provided on the same lead frame 17.

In addition, the semiconductor module 11 is configured such that the control terminal 14a of the IGBT 14 and the control terminal 15a of the MOSFET 15 are each connected to the control circuit board 30, in which the control terminal 14a is a gate electrode of the IGBT 14, and the control terminal 15a is a gate electrode of MOSFET 15.

Figure 7:
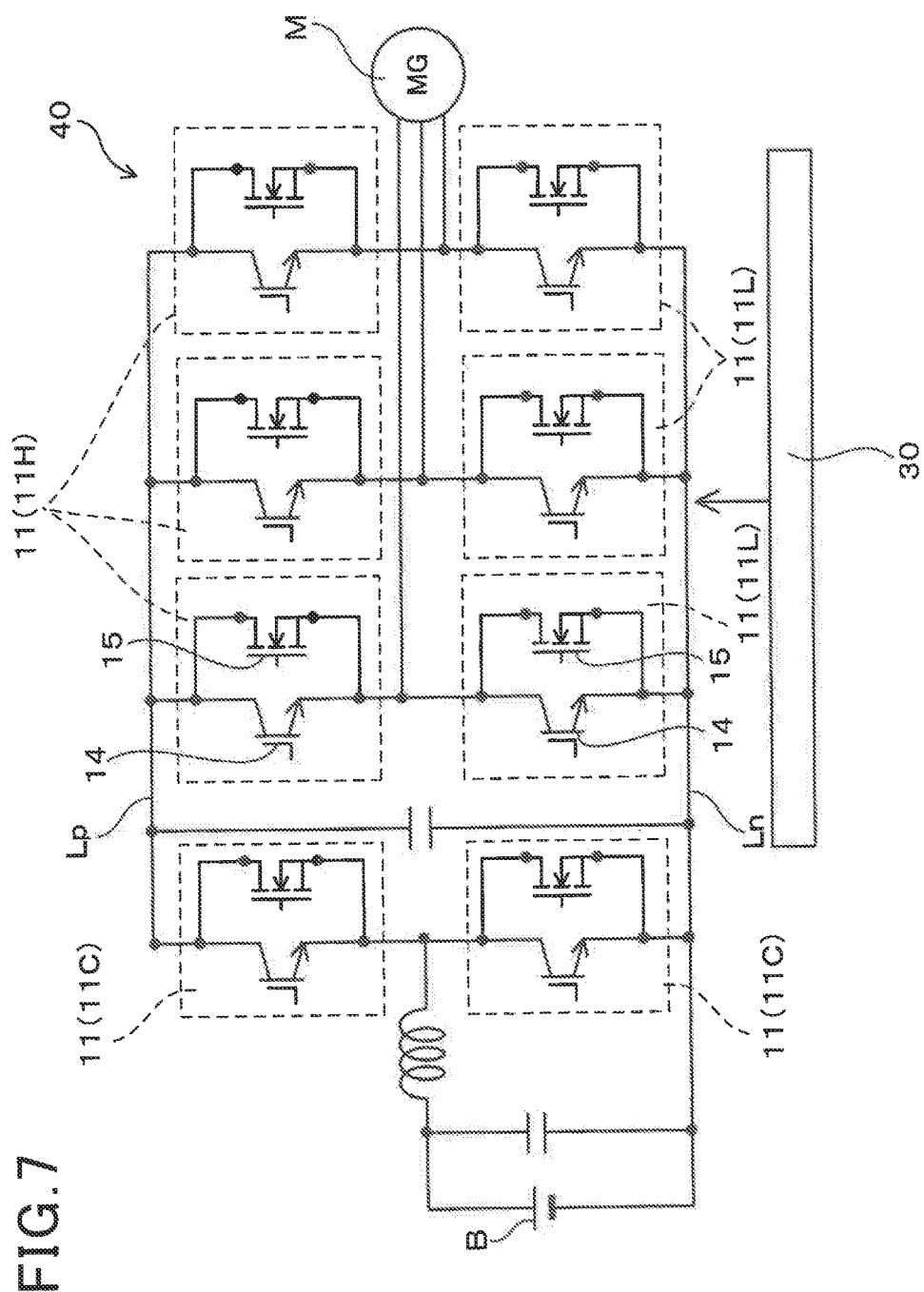
FIG. 7 is an inverter circuit diagram of the power conversion apparatus in FIG. 1.

As shown in FIG. 7, an inverter circuit 40 of the power conversion apparatus 1 is configured through use of a plurality of semiconductor modules 11 (eight semiconductor modules 11 in FIG. 7). The eight semiconductor modules 11 are classified into two modules 11C and 11C that configure a boost circuit, and six modules that configure a conversion circuit.

The boost circuit boosts the voltage of a power supply B. The conversion circuit converts the boosted direct-current power to alternating-current power. The six modules of the conversion circuit are further classified into three upper-arm modules 11H and three lower-arm modules 11L. The upper-arm modules 11H are connected to a high potential-side line Lp of the power supply B. The lower-arm modules 11L are connected to a low potential-side line Ln of the power supply B.

Figure 8:
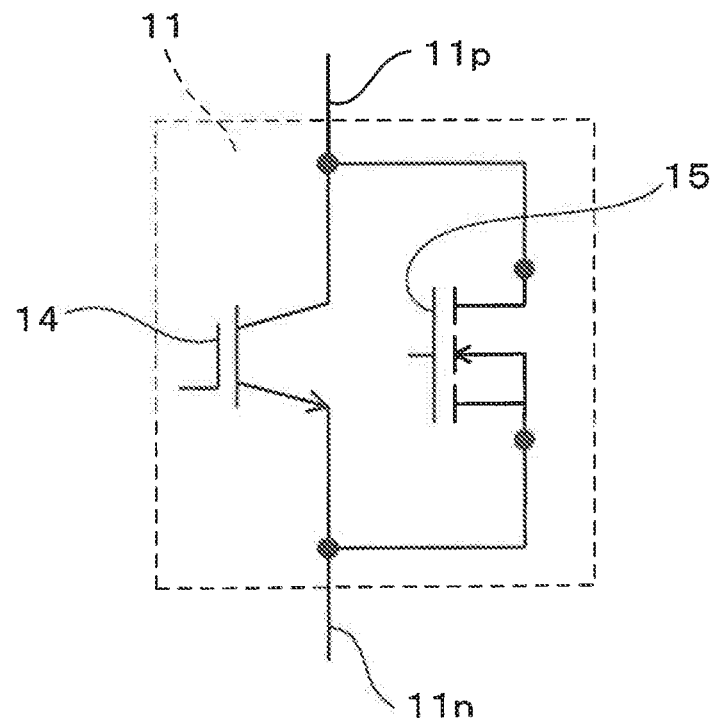
FIG. 8 is an equivalent circuit diagram of the semiconductor module in FIG. 5.

As shown in the equivalent circuit of FIG. 8, in the semiconductor module 11, the IGBT 14 and the MOSFET 15 are connected in parallel to each other. More specifically, the collector of the IGBT 14 and the drain of the MOSFET 15 are connected. The emitter of the IGBT 14 and the source of the MOSFET 15 are connected. The gate of the IGBT 14 and the gate of the MOSFET 15 are connected to the control circuit board 30. A three-phase alternating-current motor M for running a vehicle is driven by the alternating-current power acquired through the inverter circuit 40.

Figure 9:
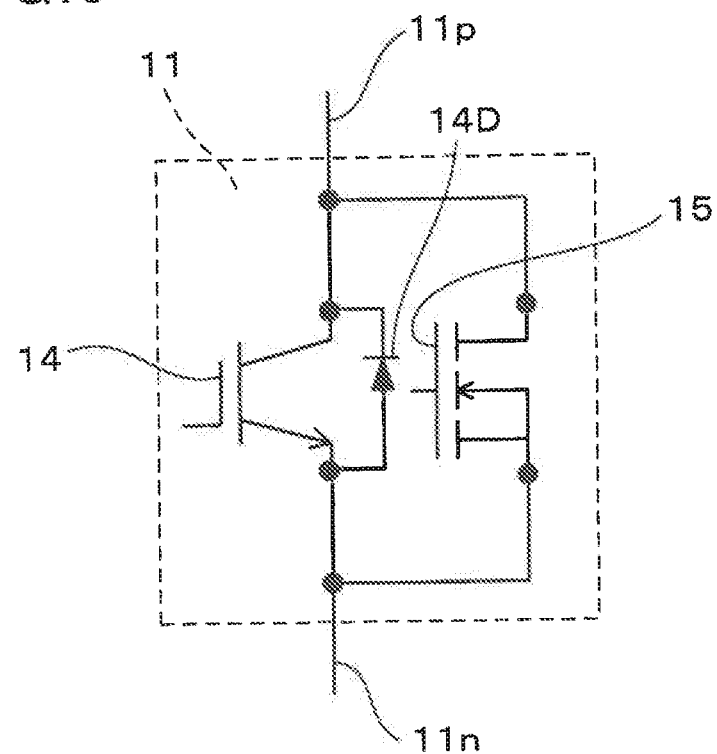
FIG. 9 is a diagram of a variation example of the equivalent circuit in FIG. 8.

In the equivalent circuit shown in FIG. 8, a structure in which the IGBT 14 and a freewheeling diode (FWD) for reflux are composed of the same element or separate elements (see FWD14D in FIG. 9) may be used. In addition, a body diode of the MOSFET 15 may also be used. Further, synchronous rectification may also be used.

Figure 10:
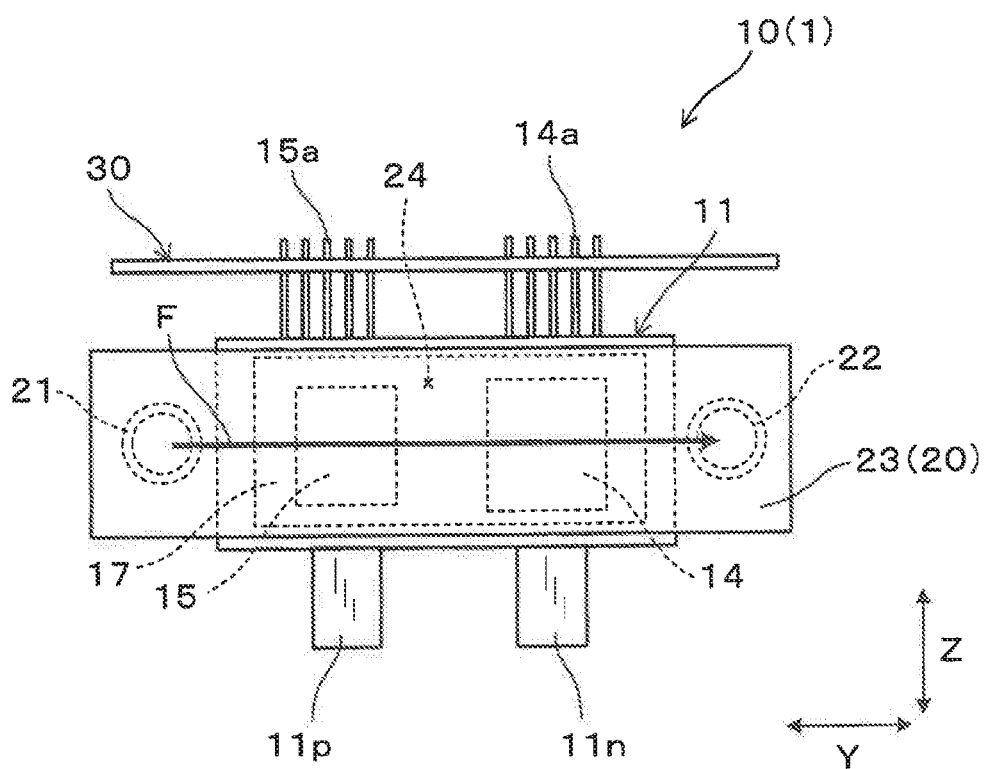
FIG. 10 is a diagram of a relationship between the semiconductor module in FIG. 5 and the flow of coolant on a coolant flow passage of a cooler.

As shown in FIG. 10, the above-described cooling tubes 23 of the cooler 20 indirectly about on the lead frames 16 (shown in FIG. 6) and 17 configuring the outer surfaces 11a and 11a (shown in FIG. 2) of the semiconductor module 11, via an insulator (not shown). The outer surfaces 11a and 11a of the semiconductor module 11 form heat-dissipating surfaces. The surface of the cooling tube 23 forms a heat-receiving surface. In this case, the coolant flow passage 24 of the cooling tube 23 is arranged to extend such that the coolant flow passage 24 and the lead frames 16 and 17 are opposed to each other.

The semiconductor module 11 is configured such that the MOSFET 15 is disposed further upstream than the IGBT 14 in the direction of the flow F (flow direction) of the coolant in the coolant flow passage 24 of the cooler 20. In other words, the semiconductor module 11 is configured such that the MOSFET 15 is not disposed further downstream than the IGBT 14 in the direction of the flow F of the coolant in the coolant flow passage 24 of the cooler 20.

The present configuration is achieved by the arrangement relationship between the IGBT 14 and the MOSFET 15 in the semiconductor module 11, the arrangement of the coolant flow passage 24 of the cooler 20, and the like being adjusted as appropriate. In the present configuration, the MOSFET 15 is cooled before the IGBT 14. Therefore, cooling of the MOSFET 15 can be enhanced.

Next, working effects of the power conversion apparatus 1 according to the first embodiment will be described.

In the power conversion apparatus 1, the coolant that flows through the coolant flow passage 24 of the cooler 20 performs heat exchange with the IGBT 14 and the MOSFET 15, through the lead frames 16 and 17. As a result, the IGBT 14 and the MOSFET 15 are both cooled. At this time, the MOSFET 15 is disposed further upstream than the IGBT 14 in the flow direction of the coolant in the coolant flow passage 24 of the cooler 20. The MOSFET 15 is not disposed further downstream than the IGBT 14 in the flow direction of the coolant in the coolant flow passage 24 of the cooler 20.

In this case, the order of priority for cooling the MOSFET 15 is not lower than that of the IGBT 14 and thus, the effect of cooling the MOSFET 15 can be enhanced with little influence from the cooling state of the IGBT 14. Therefore, temperature rise in the MOSFET 15 can be reliably suppressed. As a result, the temperature of the MOSFET 15 does not easily become high, and increase in conduction loss (also referred to as on-state power loss) in the MOSFET 15 (semiconductor module 11) can be suppressed. Here, conduction loss refers to loss (product of voltage and current) that occurs during an ON period excluding the switching time of the switching element.

In addition, as a result of the increase in conduction loss in the MOSFET 15 being suppressed, the element size of the MOSFET 15 can be reduced.

In the above-described power conversion apparatus 1, the cooling tubes 23 of the cooler 20 abut on the two outer surfaces 11a and 11a of the semiconductor modules 11. Therefore, the effect of cooling the semiconductor module 11 can be enhanced.

In addition, the cooler 20 includes the heat dissipating fins 25 that extend in the direction intersecting the flow direction of the coolant in the coolant flow passage 24. Therefore, the effect of cooling the semiconductor module 11 can be further enhanced. In this case, temperature rise in the coolant for cooling the IGBT 14 disposed on the downstream side of the cooling tube 23 in the semiconductor module 11 is suppressed. As a result, the element size of the IGBT 14 can be reduced.

Figure 11:
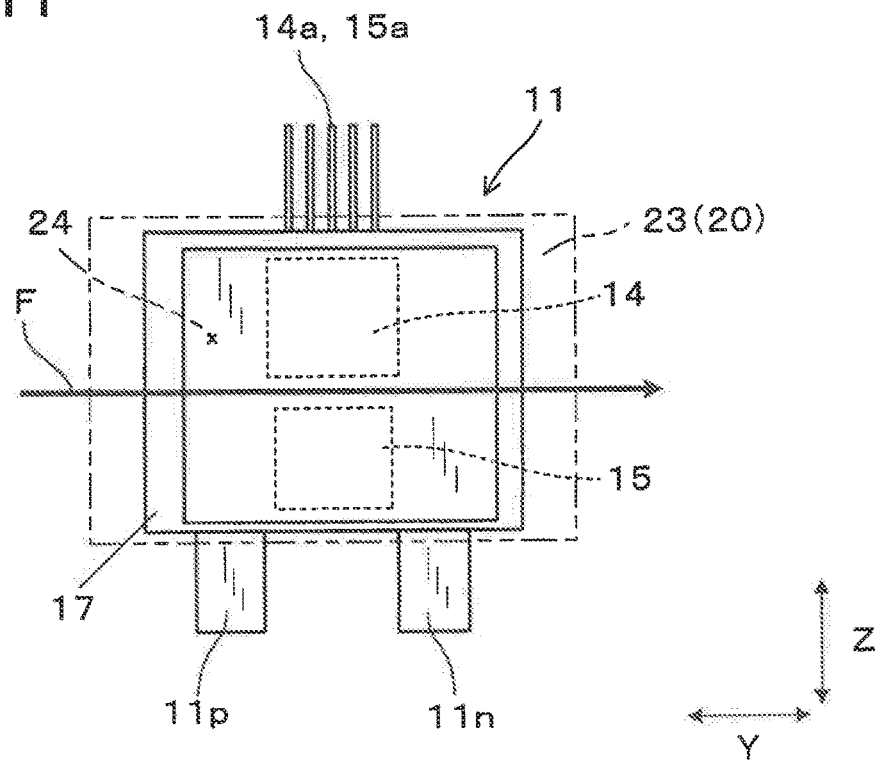
FIG. 11 is a diagram of a variation example of FIG. 10.
Figure 12:
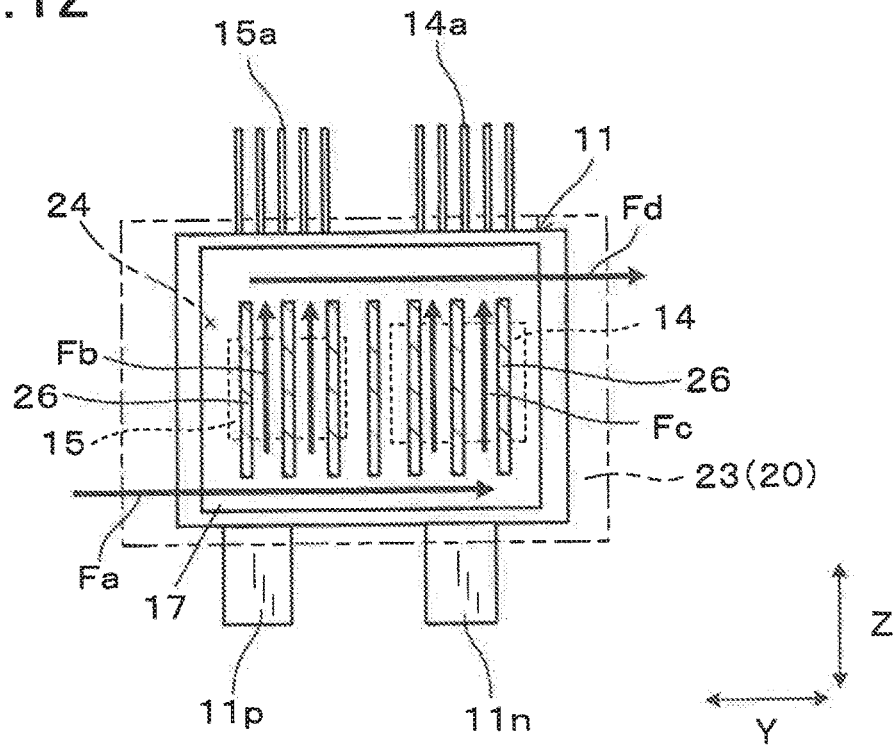
FIG. 12 is a diagram of a variation example of FIG. 10.

With respect to the arrangement of the switching elements (IGBT 14 and MOSFET 15) shown in FIG. 10, the switching elements may also be arranged as shown in FIGS. 11 and 12.

A semiconductor module 11 shown in FIG. 11 is configured such that the MOSFET 15 is disposed in a position similar to that of the IGBT 14 in the direction of the flow F of the coolant in the coolant flow passage 24 of the cooler 20. In this case as well, in a manner similar to that in FIG. 9, the MOSFET 15 is not disposed further downstream than the IGBT 14 in the direction of the flow F of the coolant in the coolant flow passage 24 of the cooler 20.

In addition, in the semiconductor module 11 shown in FIG. 12, the cooling tube 23 of the cooler 20 is configured such that four different coolant flows Fa, Fb, Fc, and Fd are formed in the coolant flow passage 24. In the coolant flow passage 24, the flow Fa of coolant flowing into the coolant tube 23 branches out into the two flows Fb and Fc that flow in parallel with respect to the MOSFET 15 and the IGBT 14. Then, the coolant forms the merged coolant flow Fd and flows out from the coolant tube 23.

The flow of coolant such as this is formed by a plurality of heat dissipating fins 26 provided in the coolant flow passage 24 of the cooling tube 23. The plurality of heat dissipating fins 26 are configured so as to extend in parallel to each other in the third direction Z. In a manner similar to the heat dissipating fins 25 described above, the plurality of heat dissipating fins 26 achieve the effect of improving heat exchange efficiency by increasing the contact area with the coolant, thereby enhancing cooling performance. In this case as well, in a manner similar to that in FIG. 10, the MOSFET 15 is not disposed further downstream than the IGBT 14, relative to the coolant flows Fa, Fb, Fc, and Fd in the coolant flow passage 24 of the cooler 20.

Therefore, in the cases of the arrangement aspects of the switching elements such as those shown in FIGS. 11 and 12 as well, cooling of the MOSFET 15 can be enhanced, and temperature rise in the MOSFET 15 can be reliably suppressed.

Second Embodiment

A power conversion apparatus 2 according to a second embodiment differs from the power conversion apparatus 1 according to the first embodiment in that the number of semiconductor element pairs composed of the IGBT 14 and the MOSFET 15 differs. That is, a semiconductor module 111 of the power conversion apparatus 2 includes two semiconductor element pairs composed of the IGBT 14 and the MOSFET 15.

The semiconductor module 111 includes two semiconductor element pairs in which the IGBT 14 and the MOSFET 15 are connected in parallel to each other. The two semiconductor element pairs are connected in series between the high potential-side line Lp and the low potential side-line Ln of the power supply B. The semiconductor module 111 is referred to as a two-in-one module. The semiconductor module 111 has a configuration in which a single upper-arm module 11H and a single lower-arm module 11L in FIG. 7 are combined.

A semiconductor module including three or more semiconductor element pairs may also be used as required. Other configurations are similar to those according to the first embodiment.

Figure 13:
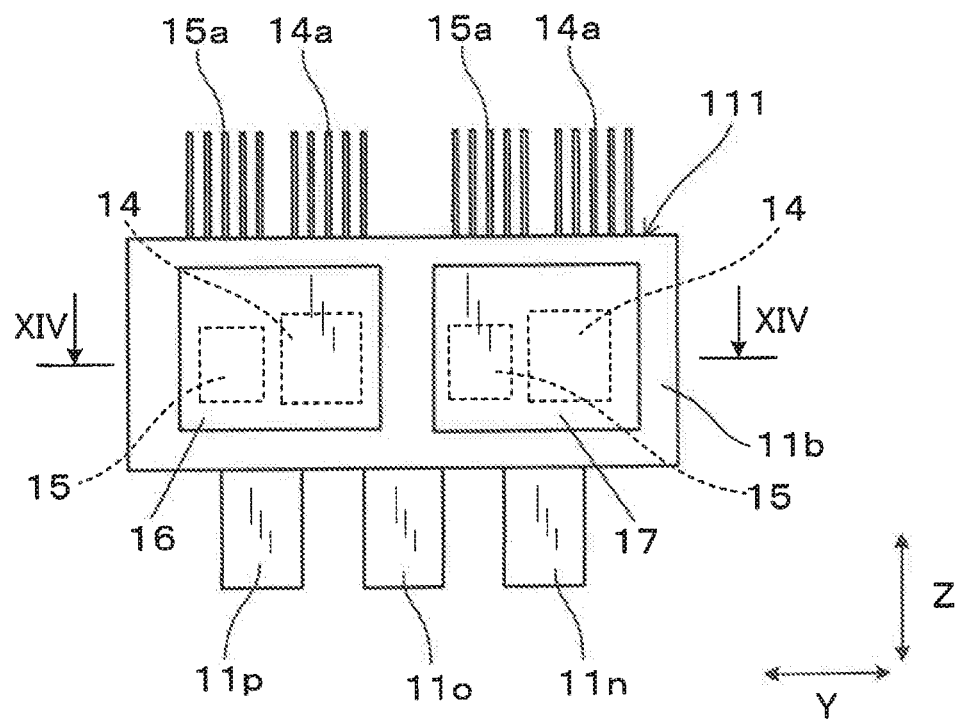
FIG. 13 is a side view in a thickness direction of a semiconductor module in a power conversion apparatus according to a second embodiment.
Figure 15:
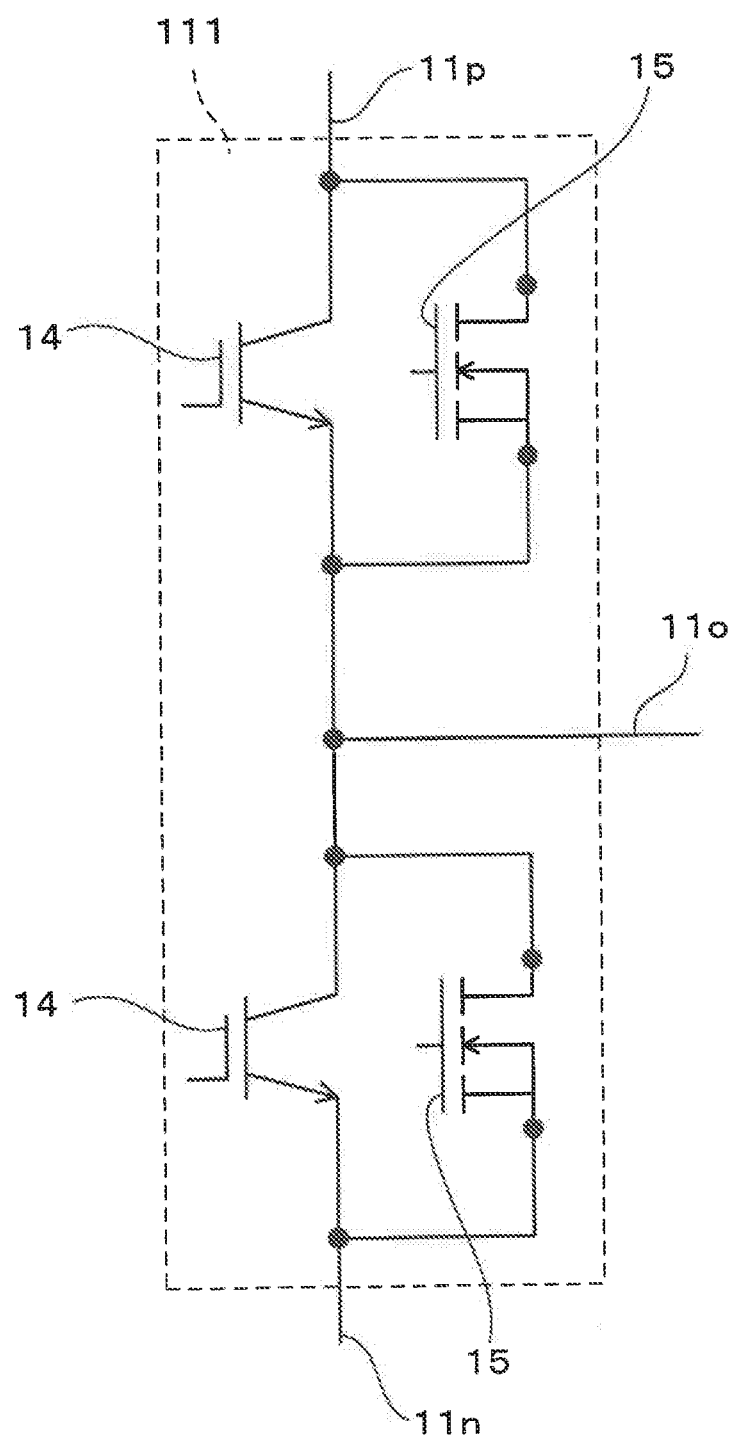
FIG. 15 is an equivalent circuit diagram of the semiconductor module in FIG. 13.

As shown in FIGS. 13 and 15, the semiconductor module 11 includes the P terminal 11p, the N terminal 11n, and an O terminal 11o as the power terminals. A direct-current voltage is applied to the semiconductor module 111 via the P terminal 11p and the N terminal 11n. Alternating-current power is outputted from the semiconductor module 111 via the O terminal 11o.

Figure 16:
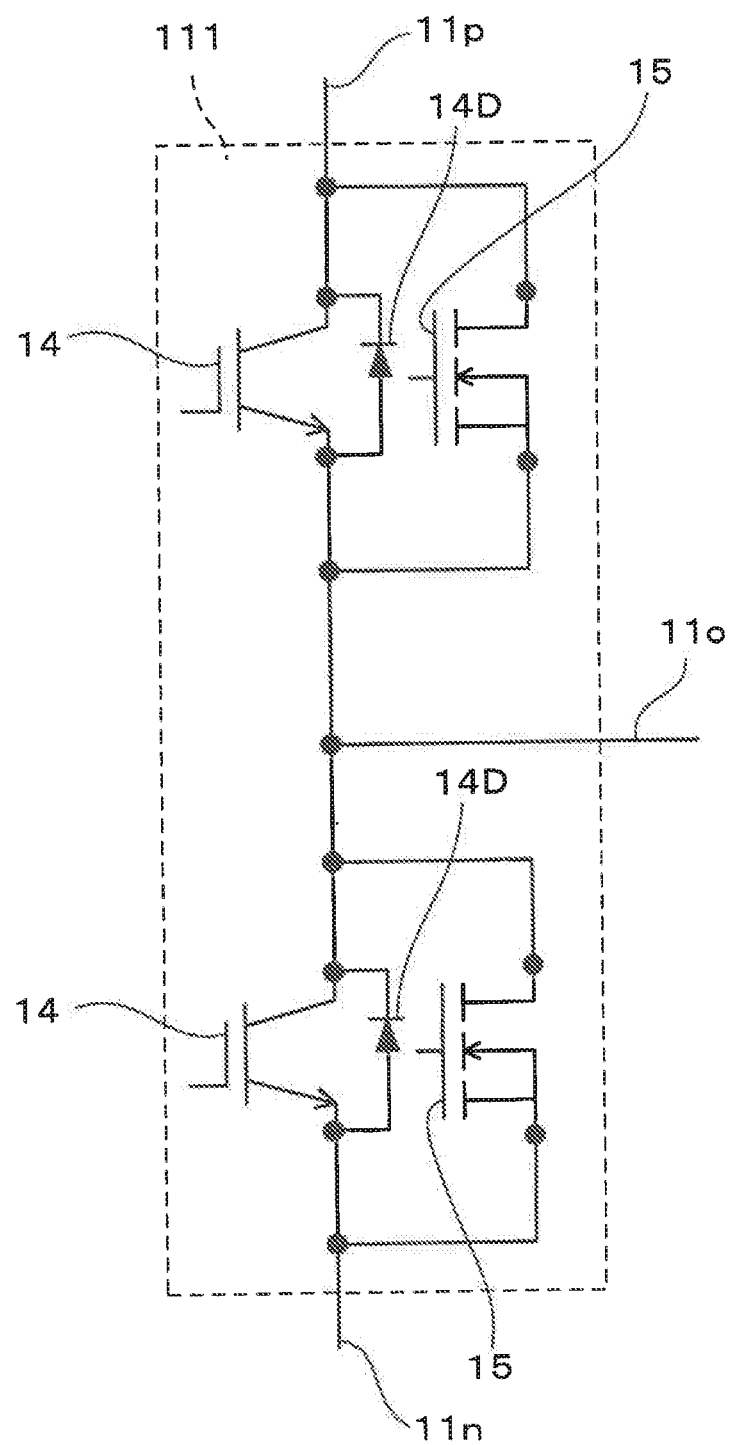
FIG. 16 is a diagram of a variation example of the equivalent circuit in FIG. 15.

In the equivalent circuit shown in FIG. 15, a structure in which the IGBT 14 and an FWD for reflux are composed of the same element or separate elements (see FWD14D in FIG. 16) may be used. In addition, a body diode of the MOSFET 15 may also be used. Further, synchronous rectification may also be used.

Figure 14:
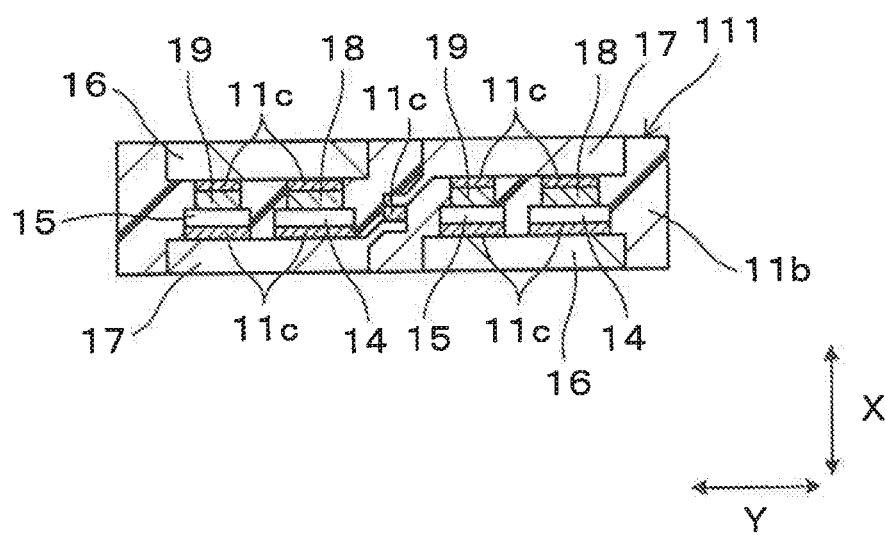
FIG. 14 is a cross-sectional view taken along line XIV-XIV in FIG. 13.

As shown in FIG. 14, the semiconductor module 111 is molded with molding resin 11b in a manner similar to the semiconductor module 11.

One element surface of the IGBT 14 on the left side in FIG. 14 is joined to the lead frame 17 via a solder layer 11c. The other element surface of the IGBT on the left side is joined to the terminal 18 that is joined to the lead frame 16 via another solder layer 11c. One element surface of the IGBT 14 on the right side in FIG. 14 is joined to the lead frame 16 via a solder layer 11c. The other element surface of the IGBT 14 on the right side is joined to the terminal 18 that is joined to the lead frame 17 via another solder layer 11c. The lead frame 17 is configured such that two frames are integrated by a solder layer 11c.

One element surface of the MOSFET 15 on the left side in FIG. 14 is joined to the lead frame 17 via a solder layer 11c. The other element surface of the MOSFET 15 on the left side is joined to the terminal 19 that is joined to the lead frame 16 via another solder layer 11c. One element surface of the MOSFET 15 on the right side in FIG. 14 is joined is joined to the lead frame 16 via a solder layer 11c. The other element surface of the MOSFET 15 is joined to the terminal 19 that is joined to the lead frame 17 via another solder layer 11c.

In the semiconductor module 111, the P terminal 11p extends along the third direction Z from one lead frame 16. The N terminal 11n extends along the third direction Z from the other lead frame 16.

In the semiconductor module 111 according to the present embodiment, the IGBT 14 and the MOSFET 15 of one semiconductor element pair are provided on the same lead frame 16. The IGBT 14 and the MOSFET 15 of the other semiconductor element pair are provided on the same lead frame 17.

Figure 17:
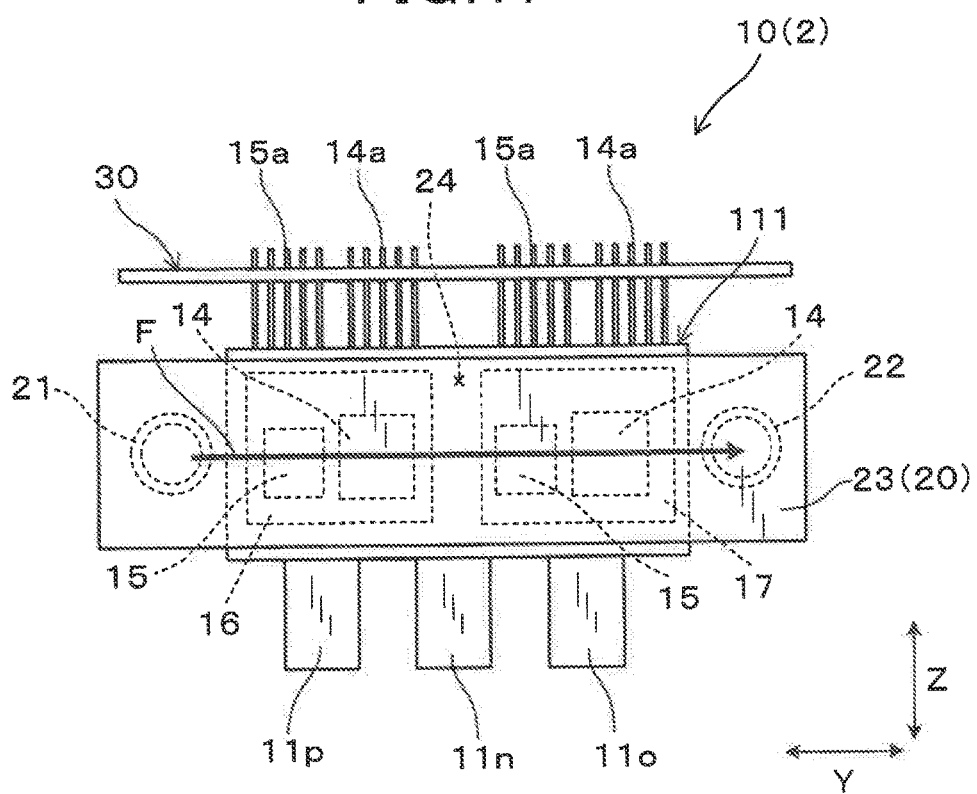
FIG. 17 is a diagram of a relationship between the semiconductor module in FIG. 13 and the flow of coolant on a coolant flow passage of a cooler.

As shown in FIG. 17, the semiconductor module 111 is configured such that the MOSFET 15 is disposed further upstream than the IGBT 14 in the direction of the flow F of coolant in the coolant flow passage 24 of the cooler 20 on the same lead frame 16. In addition, the MOSFET 15 is disposed further upstream than the IGBT 14 in the direction of the flow F of coolant in the coolant flow passage 24 of the cooler 20 on the same lead frame 17.

In other words, the semiconductor module 111 is configured such that the MOSFET 15 is not disposed further downstream than the IGBT 14 in the direction of the flow F of coolant in the coolant flow passage 24 of the cooler 20. As a result of the present configuration, the MOSFET 15 is cooled before the IGBT 14 on one lead frame 16. In addition, the MOSFET 15 is cooled before the IGBT 14 on the other lead frame 17. Therefore, cooling of the MOSFETs 15 can be enhanced.

In the power conversion apparatus 2, in a manner similar to that in the power conversion apparatus 1, temperature rise in the MOSFETs 15 can be reliably suppressed. Increase in conduction loss in the MOSFETs 15 (semiconductor module 111) is suppressed. In addition, working effects similar to those according to the first embodiment are achieved.

Figure 18:
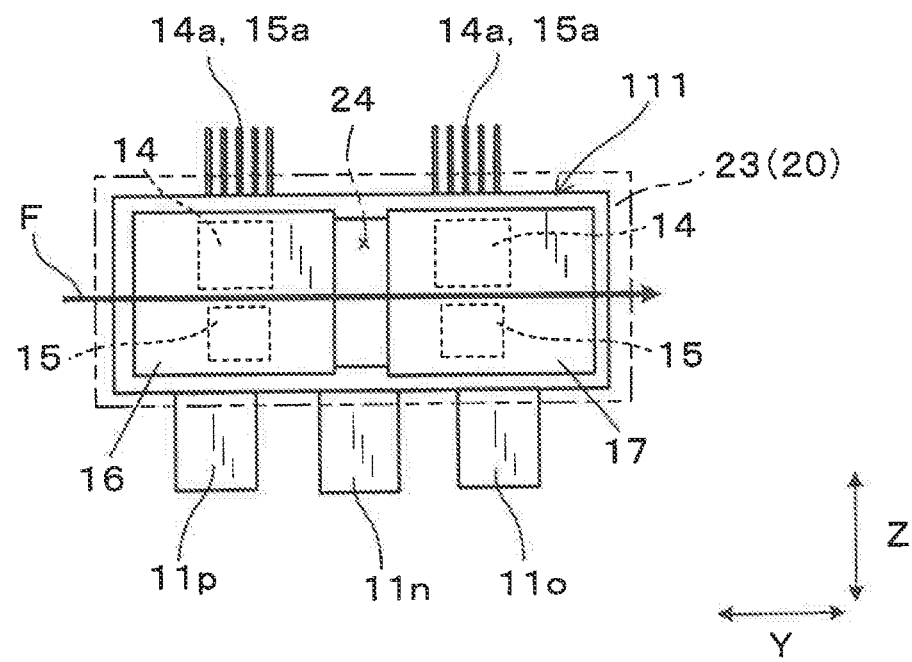
FIG. 18 is a variation example of FIG. 17.
Figure 19:
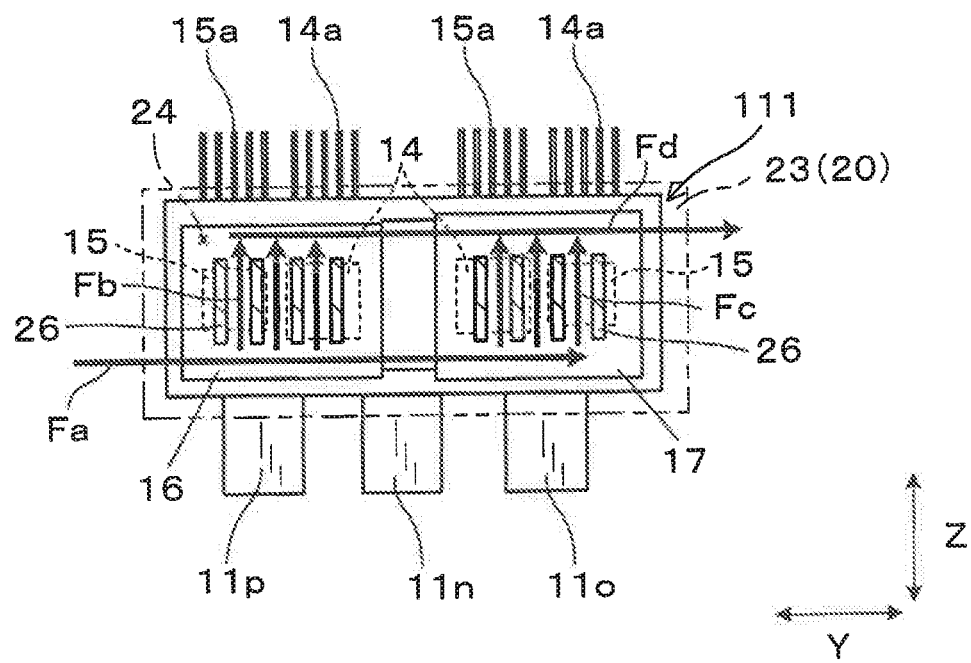
FIG. 19 is a variation example of FIG. 17.

With respect to the arrangement of the switching elements (IGBTs 14 and MOSFETs 15) shown in FIG. 17, the switching elements may also be arranged as shown in FIGS. 18 and 19.

The semiconductor module 111 shown in FIG. 18 is configured such that the MOSFET 15 is disposed in a position similar to that of the IGBT 14 in the direction of the flow F of coolant in the coolant flow passage 24 of the cooler 20 on the same lead frame 16. In addition, the MOSFET 15 is disposed in a position similar to that of the IGBT 14 in the direction of the flow F of coolant in the coolant flow passage 24 of the cooler 20 on the same lead frame 17. In this case as well, in a manner similar to that in FIG. 17, the MOSFET 15 is not disposed further downstream than the IGBT 14 in the direction of the flow F of coolant in the coolant flow passage 24 of the cooler 20 on either of the same lead frames 16 and 17.

In addition, in the semiconductor module 111 shown in FIG. 19, the switching elements are arranged such that the MOSFET 15, the IGBT 14, the IGBT 14, and the MOSFET 15 are disposed in order from the left side in FIG. 19, in the second direction Y. Furthermore, the cooling tube 23 of the cooler 20 is configured such that four different coolant flows Fa, Fb, Fc, and Fd are formed in the coolant flow passage 24.

In this coolant flow passage 24, the flow Fa of coolant flowing into the coolant tube 23 branches out into the two flows Fb and Fc that flow in parallel with respect to the two semiconductor element pairs. Then, the coolant forms the merged coolant flow Fd and flows out from the coolant tube 23. At this time, the IGBT 14 and the MOSFET 15 of one semiconductor element pair are cooled at the same timing by the coolant flow Fb. In addition, the IGBT 14 and the MOSFET 15 of the other semiconductor element pair are cooled at the same timing by the coolant flow Fc.

The flow of coolant such as this is formed by a plurality of heat dissipating fins 26, similar to the above-described heat dissipating fins 26 (see FIG. 12), being provided in the coolant flow passage 24 of the cooling tube 23. In this case as well, in a manner similar to that in FIG. 17, the MOSFET 15 is not disposed further downstream than the IGBT 14, relative to the coolant flow Fa, Fb, Fc, and Fd in the coolant flow passage 24 of the cooler 20, on either of the same lead frames 16 and 17.

Therefore, in the cases of the arrangement aspects of the switching elements such as those shown in FIGS. 18 and 19 as well, cooling of the MOSFETs 15 can be enhanced, and temperature rise in the MOSFETs 15 can be reliably suppressed.

The present disclosure is not solely limited to the above-described typical embodiments. Various applications and modifications can be considered without departing from the object of the present disclosure. For example, the following embodiments are possible through application of the above-described embodiments.

According to the above-described embodiments, an example is given in which the cooler 20 is provided with the heat dissipating fins 25 and 26 that extend in the direction intersecting the flow direction of the coolant in the coolant flow passage 24. However, at least either of the heat dissipating fins 25 and 26 can be omitted as required.

According to the above-described embodiments, an example is given of the cooler 20 in which the cooling tubes 23 are provided so as to abut on the two outer surfaces 11a and 11a of the semiconductor module 11. However, instead of the cooler 20, a cooler configured such that a cooling surface abuts on only one outer surface 11a of the semiconductor module 11 may also be used.

According to the above-described embodiments, an example is given in which the IGBT 14 composed of a Si-based material and the MOSFET 15 composed of a SiC-based material are used. However, the IGBT 14 composed of a material other than the Si-based material and the MOSFET 15 composed of a material other than the SiC-based material may also be used.

What is claimed is:

1. A power conversion apparatus that performs power conversion, the power conversion apparatus comprising:
a semiconductor module that includes an insulated-gate bipolar transistor, a metal-oxide-semiconductor field-effect transistor, and a lead frame, the insulated-gate bipolar transistor and the metal-oxide-semiconductor field-effect transistor being connected in parallel to each other and provided on the same lead frame, and a chip area of the metal-oxide-semiconductor field-effect transistor is smaller than a chip area of the insulated-gate bipolar transistor; and
a cooler that has a coolant flow passage, the coolant flow passage extending such that the coolant flow passage and the lead frame of the semiconductor module are opposed to each other,
the semiconductor module being configured such that the metal-oxide-semiconductor field-effect transistor is not disposed further downstream than the insulated-gate bipolar transistor in a flow direction of a coolant in the coolant flow passage of the cooler,
wherein a control terminal of the metal-oxide-semiconductor field-effect transistor is not disposed further downstream than a control terminal of the insulated-grate bipolar transistor in the flow direction of the coolant.

2. The power conversion apparatus according to claim 1, wherein:
the semiconductor module is configured such that the metal-oxide-semiconductor field-effect transistor is disposed further upstream than the insulated-gate bipolar transistor in the flow direction of the coolant in the coolant flow passage of the cooler.

3. The power conversion apparatus according to claim 2, wherein:
the cooler includes a heat dissipating fin that extends in a direction intersecting the flow direction of the coolant in the coolant flow passage.

4. The power conversion apparatus according to claim 3, wherein:
the semiconductor module has two outer surfaces that extend in parallel to each other; and
the cooler includes cooling tubes that form the coolant flow passage, the cooling tubes being provided so as to abut on each of the two outer surfaces of the semiconductor module.

5. The power conversion apparatus according to claim 4, wherein:
the metal-oxide-semiconductor field-effect transistor comprises a wide-bandgap semiconductor element.

6. The power conversion apparatus according to claim 1, wherein:
the cooler includes a heat dissipating fin that extends in a direction intersecting the flow direction of the coolant in the coolant flow passage.

7. The power conversion apparatus according to claim 1, wherein:
the semiconductor module has two outer surfaces that extend in parallel to each other; and
the cooler includes cooling tubes that form the coolant flow passage, the cooling tubes being provided so as to abut on each of the two outer surfaces of the semiconductor module.

8. The power conversion apparatus according to claim 2, wherein:
the semiconductor module has two outer surfaces that extend in parallel to each other; and
the cooler includes cooling tubes that form the coolant flow passage, the cooling tubes being provided so as to abut on each of the two outer surfaces of the semiconductor module.

9. The power conversion apparatus according to claim 1, wherein:
the metal-oxide-semiconductor field-effect transistor comprises a wide-bandgap semiconductor element.

10. The power conversion apparatus according to claim 2, wherein:
   the metal-oxide-semiconductor field-effect transistor comprises a wide-bandgap semiconductor element.

11. The power conversion apparatus according to claim 3, wherein:
   the metal-oxide-semiconductor field-effect transistor comprises a wide-bandgap semiconductor element.

* * * * *